United States Patent [19]
Tsai et al.

[11] Patent Number: 5,691,669
[45] Date of Patent: Nov. 25, 1997

[54] DUAL ADJUST CURRENT CONTROLLED PHASE LOCKED LOOP

[75] Inventors: Li Ching Tsai; Hugh S. C. Wallace, both of Ft. Collins, Colo.

[73] Assignee: Hewlett-Packard Co., Palo Alto, Calif.

[21] Appl. No.: 585,053

[22] Filed: Jan. 11, 1996

[51] Int. Cl.[6] .................................................. H03L 7/099
[52] U.S. Cl. ........................ 331/17; 331/DIG. 2; 331/34; 331/57
[58] Field of Search .............................. 331/176, DIG. 2, 331/17, 57

[56] References Cited

U.S. PATENT DOCUMENTS

| | | | |
|---|---|---|---|
| 4,546,331 | 10/1985 | DaSilva et al. | 332/19 |
| 4,573,026 | 2/1986 | Curtis et al. | 332/18 |
| 4,795,985 | 1/1989 | Gailbreath et al. | 328/155 |
| 4,810,977 | 3/1989 | Flugstead et al. | 332/19 |
| 5,206,889 | 4/1993 | Unkrich | 377/20 |
| 5,302,920 | 4/1994 | Bitting | 331/45 |
| 5,490,182 | 2/1996 | Arai | 375/376 |
| 5,559,473 | 9/1996 | Anderson et al. | 331/34 |

OTHER PUBLICATIONS

U.S. application No. 08/506,432, Meier et al., filed Jul. 24, 1995.

*Primary Examiner*—Robert Pascal
*Assistant Examiner*—An T. Luu

[57] ABSTRACT

A dual adjust current-controlled phase locked loop is provided for allowing multiple-gain frequency acquisition of a signal. The dual adjust current-controlled phase locked loop includes a phase detector responsive to a reference signal and a synthesized signal for producing a phase error signal; a controller responsive to the phase error signal for generating coarse and fine adjust control signals; and a dual adjust current-controlled oscillator responsive to the coarse and fine adjust control signals for adjusting the oscillating frequency of the synthesized signal. The dual adjust current controlled oscillator includes a differential current controlled ring oscillator comprising a series of delay elements. Each delay element includes a high gain circuit responsive to the coarse adjust control signal and a low gain circuit responsive to the fine adjust control signal.

18 Claims, 9 Drawing Sheets

DUAL ADJUST CURRENT CONTROLLED PHASE LOCKED LOOP

FIELD OF THE INVENTION

The present invention relates generally to a frequency synthesizer, and more particularly to a phase locked loop employing a dual-adjust current-controlled oscillator having a coarse adjust control and a fine adjust control for controlling the frequency of an output signal, and a controller for providing automatic adjustment of, and switching between, the coarse adjust control and fine adjust control of the dual-adjust current controlled oscillator.

BACKGROUND OF THE INVENTION

Generally, phase locked loops are used to detect a signal which has been phase or frequency modulated. Applications include tracking voltage or temperature drifts. Usually, phase locked loops are configured as a feedback loop, including a tunable oscillator (typically a voltage controlled oscillator (VCO)), whose output frequency is locked to the frequency of a known reference signal by means of a phase comparator. The phase comparator generates an output voltage or current that is proportional to the phase difference between the VCO output signal and the reference signal. The phase comparator output is fed back to the input of the VCO via a control block to tune the VCO to a desired frequency and eliminate any phase difference at the phase comparator.

Phase locked loops can be constructed to operate in either the analog or digital signal environments. Analog phase lock loops are prone to locking to harmonics and are also vulnerable to noise and data drop out. It is challenging to build an analog system with stable loop response while maintaining good performance. Changes in the loop response causes changes in the frequency range, resulting in undesired range switching.

In the digital signal environment, two major problems plague digital phase locked loops. First, varying the frequency range by adjusting the VCO control voltage during tracking of the reference signal can produce excessive clock jitter. In other words, if the VCO frequency changes too fast, the noise in the system causes the edges of the clock pulse to move back and forth during tracking.

Second, during tracking of the reference signal, the output of the VCO is not linear. As the control voltage VC for the voltage controlled oscillator increases, the corresponding frequency output from the voltage controlled oscillator (VCO) may not increase linearly or monotonically as desired.

One method of preventing the PLL from correcting the frequency shift of the VCO output signal involves adding or subtracting a pulse from the VCO output signal for each two pi radians of phase accumulation due to the deviation from the center frequency. Properly scaling the gains of each signal path provides a linear response both inside and outside the PLL bandwidth. Such a technique is disclosed in U.S. Pat. No. 4,546,331 issued to DaSilva et. al. on Oct. 8, 1985 entitled Frequency Modulation in a Phase-Locked Loop. The described technique is often employed to accomplish FM in PLL s; however, it has some important limitations.

There are two characteristics which inherently limit the amount of frequency deviation from the center frequency that is obtainable in a PLL. First, phase detectors or phase comparators typically operate linearly over only a range of a few degrees or a small fraction of a radian. This forces the maximum obtainable frequency deviation to be small at low modulation rates. Secondly, an integrator generally comprises an operational amplifier with a capacitor in its feedback path. Practical integrators cannot provide an output that is higher than the power supply voltage. This determines the maximum PM signal, further restricting the maximum FM deviation obtainable.

SUMMARY OF THE INVENTION

In accordance with the present invention, a dual-adjust current-controlled phased locked loop is provided. The dual-adjust current-controlled phased locked loop includes a dual-adjust current-controlled oscillator (ICO) which produces an ICO output frequency locked to a known reference frequency. The differential current-controlled oscillator employs common-mode rejection techniques for reducing noise considerations, and includes dual coarse and fine adjusts for allowing large control over the frequency deviation within a set frequency range while preventing range switching. The coarse adjust allows a stable frequency range to be set, while the fine adjust allows for fine-tuning the frequency within the frequency range. A phase comparator receives the known reference frequency and the oscillator output frequency to generate an output signal representing the phase difference between the reference frequency and the oscillator output frequency. A digital control block receives the phase difference signal from the phase comparator and utilizes the coarse and fine adjusts of the ICO to lock the oscillator output frequency to the known reference frequency.

The dual-adjust current-controlled phased locked loop reduces inaccuracy in the locking phase by utilizing a digital control block which generates a coarse adjust signal and a fine adjust signal for controlling the current-controlled oscillator. During the PLL acquisition (locking) phase, the coarse-adjust signal is used to set the ICO current, and the fine-adjust signal is set to the mid-range. After achieving phase lock, a fine-adjust signal is used to track voltage and temperature drifts. As long as the fine-adjust signal has enough range to compensate for frequency drift during tracking, range switching is avoided.

BRIEF DESCRIPTION OF THE DRAWINGS

An illustrative and presently preferred embodiment of the invention is shown in the accompanying drawings in which.

DETAILED DESCRIPTION OF THE INVENTION

Figure 1:
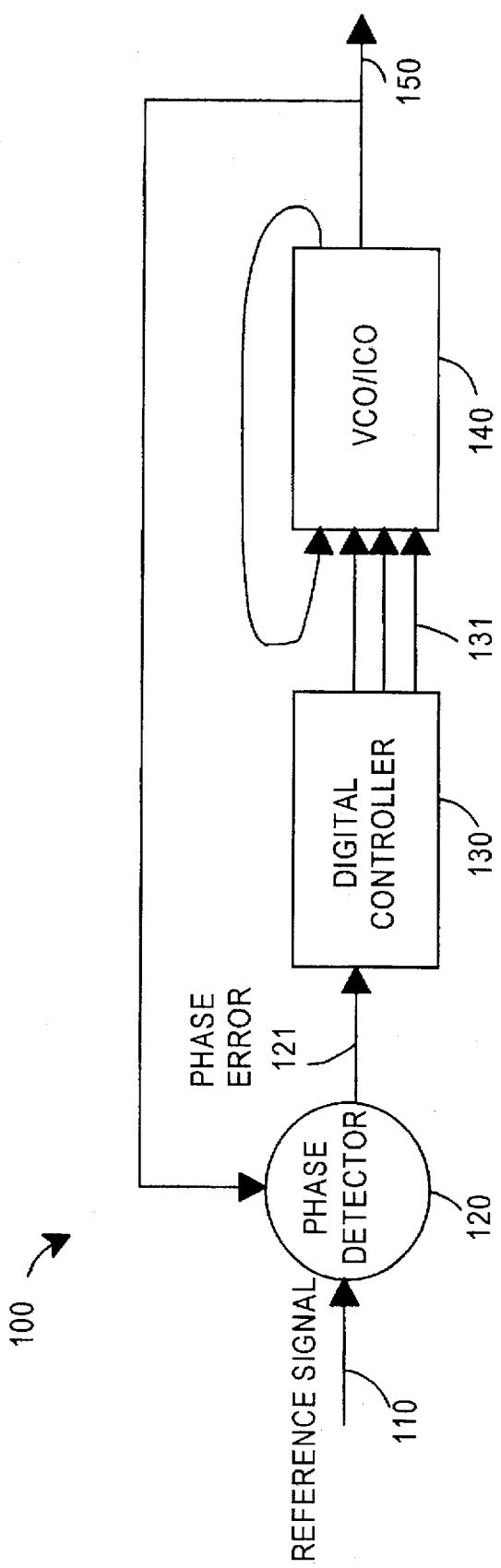
FIG. 1 is a block diagram of a typical digital phase locked loop.

The drawing, in general, depicts a phase locked loop for providing multiple-gain frequency acquisition of a signal. The phased locked loop includes a phase detector responsive to a reference signal and a synthesized signal for producing a phase error signal. The phase locked loop also includes a controller responsive to the phase error signal for generating a coarse adjust control signal and a fine adjust control signal. Finally, the phase locked loop includes a dual adjust current-controlled oscillator responsive to the coarse adjust control signal and the fine adjust control signal, for producing the synthesized signal at an oscillating frequency. The dual adjust current controlled oscillator includes a high gain circuit responsive to the coarse adjust control signal and a low gain circuit responsive to the fine adjust control signal.

For the purpose of the following discussion, the term "high" corresponds to a logical 1 (typically 5 volts), and the term "low" corresponds to a logical 0 (typically 0 volts). As will be appreciated to one skilled in the art, depending on the implementation of the circuit configurations, a "high" may correspond to 0 volts while a "low" may correspond to 5 volts.

1. The Typical Phase Locked Loop

Figure 2:
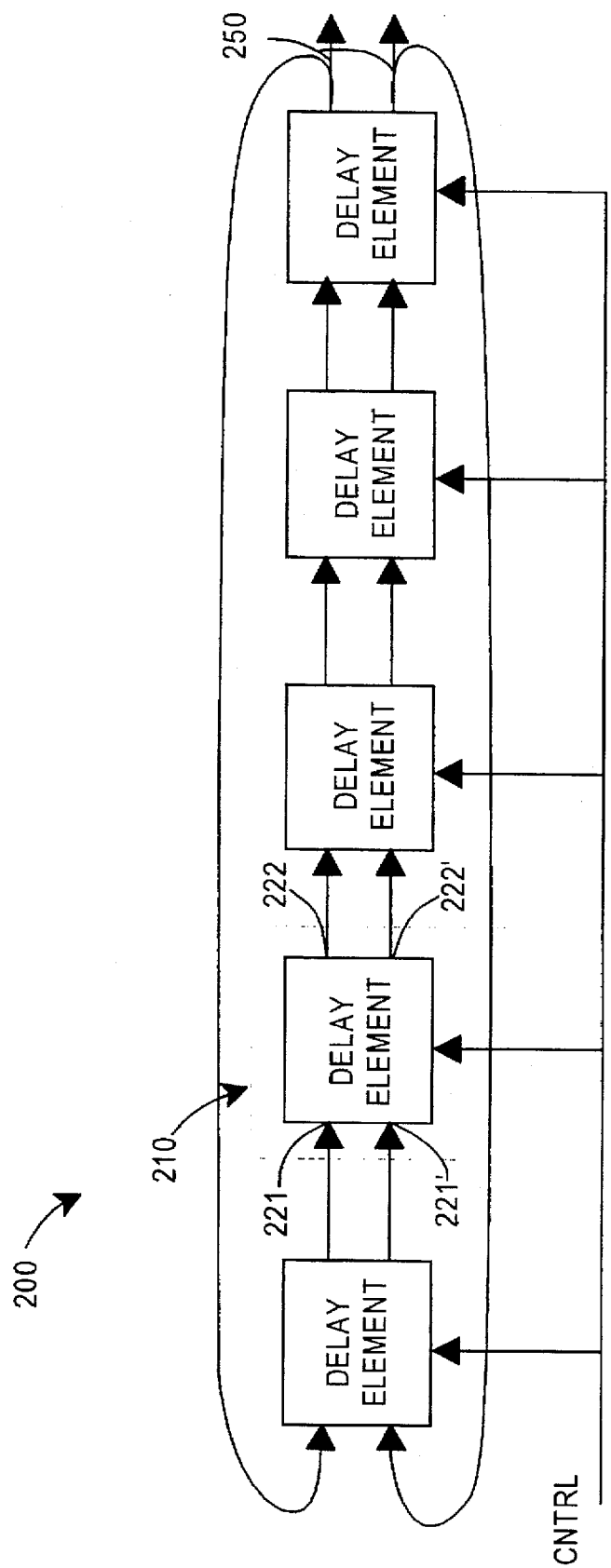
FIG. 2 is a block diagram of a typical current controlled oscillator arranged as a ring oscillator.
Figure 3:
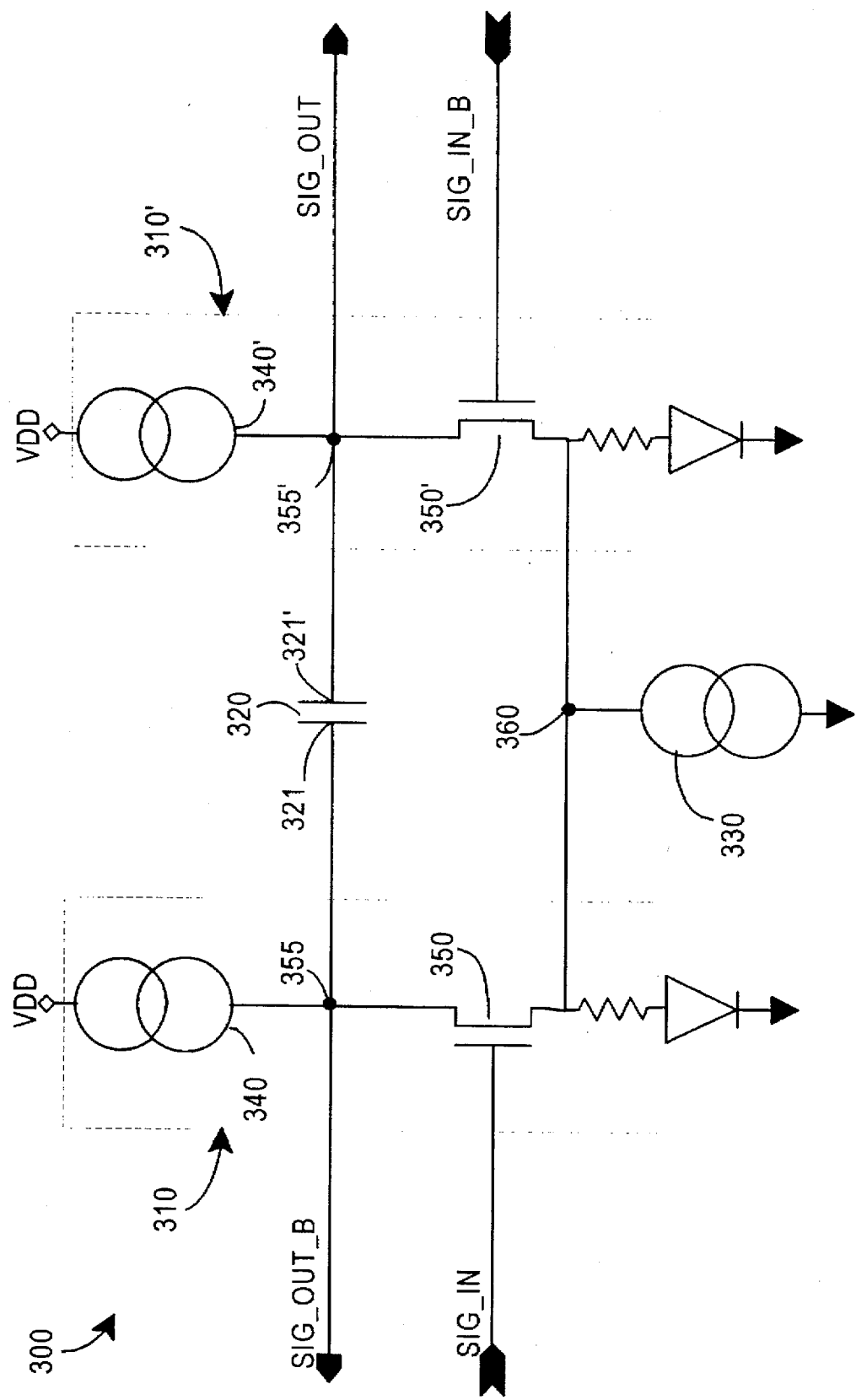
FIG. 3 is a schematic block diagram of a typical delay element for the typical current controlled oscillator of FIG. 2.

The present invention is best understood by first examining a typical phased locked loop which uses a current controlled oscillator, as shown in FIGS. 1–3. FIG. 1 illustrates a typical digital phase locked loop 100. As shown in FIG. 1, a phase detector 120 compares a reference signal 110 with a synthesized signal 150 to generate a phase error signal 121. A digital controller 130 receives the phase error signal 121 from the phase detector 120 to generate digital control signals 131 for adjusting the frequency of the synthesized signal 150. A current-controlled oscillator (ICO) 140 receives the digital control signals 131 and accordingly adjusts the frequency of the synthesized signal 150 up or down. When a "lock" is achieved, the synthesized signal 150 matches the reference signal 110 in both phase and frequency. A lock indicates that stable circuit operation has been achieved.

A ring oscillator 200, shown in block diagram form in FIG. 2, is often used to implement the ICO 140 of FIG. 1. As shown in FIG. 2, the ring oscillator 200 comprises a series of successively arranged delay elements 210. Each delay element comprises a delay element input and a delay element output. In a ring oscillator which uses differential current mode techniques, each delay element comprises a delay element input 221, a complemented delay element input 221', a delay element output 222, and a complemented delay element output 222'. The complemented delay element input 221' is the complement of the delay element input 221. Likewise, the complemented delay element output 222' is the complement of the delay element output 222. The delay element output 222 for each delay element is connected to the delay element input 221 of its immediately subsequent delay element in the series of delay elements. Likewise, the complemented delay element output 222' for each delay element is connected to the complemented delay element input 221' of its immediately subsequent delay element in the series of delay elements. In order to provide an oscillation, the ring oscillator 200 must provide an outstanding inversion. This may be achieved by providing an odd number of delay elements, and connecting the respective delay element output 222 and complemented delay element output 222' of the last of the delay elements in the series to the respective delay element input 221 and complemented delay element input 221' of the first of the delay elements in the series to form a "ring". Alternatively, the outstanding inversion can be provided with an even number of delay elements by connecting the respective delay element output 222 and complemented delay element output 222' of the last of the delay elements in the series to the respective complemented delay element input 221' and delay element input 221 of the first of the delay elements in the series to form a "ring". The frequency of the oscillation is controlled by varying the amount of delay provided by each delay element. As shown in FIG. 2, each delay element also comprises a control means 223 for receiving a control signal, which varies the delay time, and thus the oscillating frequency of the ring oscillator output 250.

FIG. 3 depicts a typical delay element 300 used in the ring oscillator 200 of FIG. 2. The typical delay element 300 shown in FIG. 3 comprises a differential amplifier defined by first and second arm circuits 310 and 310'. The first and second arm circuits 310 and 310' are isolated by a capacitor 320, and coupled to a tail current source 330 via line 360. The capacitor 320 provides the delay factor of the delay element. The differential amplifier receives an input signal SIG_IN, and a complemented input signal SIG_IN_B which is the substantial complement of input signal SIG_IN.

The first arm circuit 310 comprises a first arm current source 340 and a first NFET 350. The first arm current source 340 is coupled between a voltage source VDD and both the drain of first NFET 350 and a first end 321 of the capacitor 320 at a first output node 355 upon which a complemented output signal SIG_OUT_B is provided. The first arm current source 340 allows only a fixed current to flow between the voltage source VDD and first NFET 350. Likewise, the second arm circuit 310' comprises a second arm current source 340' and a second NFET 350'. The second arm current source 340' is coupled between a voltage source VDD and both the drain of second NFET 350' and a second end 321' of the capacitor 320 at a second output node 355' upon which an output signal SIG_OUT is provided. The second arm current source 340' allows only a fixed current to flow between the voltage source VDD and second NFET 350'.

The tail current source 330 allows only a fixed current to flow between the source of both first and second NFETs 350, 350' and ground. The tail current source 330 provides a common-mode gain that is essentially zero, which results in a desirable high common-mode rejection ratio (CMRR).

The gate of first NFET 350 of the first arm circuit 310 is connected to receive input signal SIG_IN, while its corresponding output signal SIG_OUT is produced at second output node 355' of the second arm circuit 310'. Likewise, the gate of second NFET 350' of the second arm circuit 310' is connected to receive the complemented input signal SIG_IN_B, while its corresponding output signal SIG_OUT_B is produced at first output node 355 of the first arm circuit 310. In the delay element differential amplifier 300, it is important that the first and second NFETs 350 and 350' be electrically matched and have nearly identical threshold voltages.

The operation of the delay element 300 is as follows. It will be initially assumed that input signal SIG_IN is high and complemented input signal SIG_IN_B is low. When SIG_IN_B is low, the gate-to-source voltage VGS of second NFET 350 will not exceed the threshold voltage of second NFET 350', and no current will flow between the source and drain of second NFET 350'. However, with SIG_IN high, the gate-to-source voltage VGS of first NFET 350 will exceed the threshold voltage of first NFET 350 to the point of saturation, thereby causing all the current to flow between the source and drain of first NFET 350 and thus through the first arm circuit 310. This causes the voltage level of complemented output SIG_OUT_B at output node 355 of first arm circuit 310 to be of lower magnitude than the voltage level of output signal SIG_OUT at output node 355' of second arm circuit 310 (Note: The combined current flowing through both of the arm circuits 310' and 310 is limited to the amount of current of the tail current source 330. The voltage on line 360 will vary to keep the tail current nearly constant.)

Since SIG_OUT of the subject delay element becomes the input signal SIG_IN of the subsequent delay element, a high voltage level on SIG_IN causes the gate-to-source voltage VGS of the first NFET 350 of the subsequent delay element to exceed the threshold voltage, causing current to flow through the first arm circuit 310 of the subsequent delay element. This causes the output signal SIG_OUT of the subsequent delay element to go high. Then, since SIG_OUT of the subsequent delay element becomes SIG_IN to the next subsequent delay element, it will cause the output signal SIG_OUT of the next subsequent delay element to go high. In a continuing manner, the original high signal on SIG_IN is propagated through the delay elements to the last delay element in the ring. The low SIG_IN_B signal is propagated through the delay elements simultaneously in a similar manner. The oscillation is provided by an outstanding inversion (either through an odd number of delay elements and no signal cross-over, or through an even number of delay elements and a signal cross-over as heretofore described) which is fed back to the first delay element in the ring. This process continuously repeats, creating a voltage oscillation on the differential output signals SIG_OUT and SIG_OUT_B.

Because the capacitor 320 is coupled between output nodes 355 and 355', the capacitor will charge and discharge in relation to the change in voltage potential between the output signals SIG_OUT and SIG_OUT_B. The capacitor 320 introduces a time constant which determines how quickly the output signals at SIG_OUT and SIG_OUT_B change with respect to a change in input signal at SIG_IN and SIG_IN_B. Thus, the rate of oscillation is caused by the signal delay and may be controlled by the size of the capacitor 320. Alternatively, the delay may be controlled by controlling the amount of current supplied by the first and second arm current sources 340, 340', and the tail current source 330.

2. The Dual Adjust Current Controlled Phase Locked Loop

Turning now to the present invention, FIGS. 4–9 detail a dual adjust current controlled phase locked loop which utilizes a hybrid digital/analog controller and a dual-adjust current controlled oscillator. The phase locked loop of the present invention is constructed in a similar overall manner to the typical phase locked loop shown in FIG. 1, except that the individual components that constitute the dual adjust current controlled phase locked loop are different. Specifically, the ICO comprises a dual-adjust current controlled oscillator having a coarse adjust control for setting a frequency range and a fine adjust control which allows for frequency drift compensation while avoiding range switching. The controller provides automatic adjustment of, and automatic switching between, the coarse adjust and fine adjust controls of the dual-adjust current controlled oscillator, which provides for multiple gain flexibility.

Figure 4:
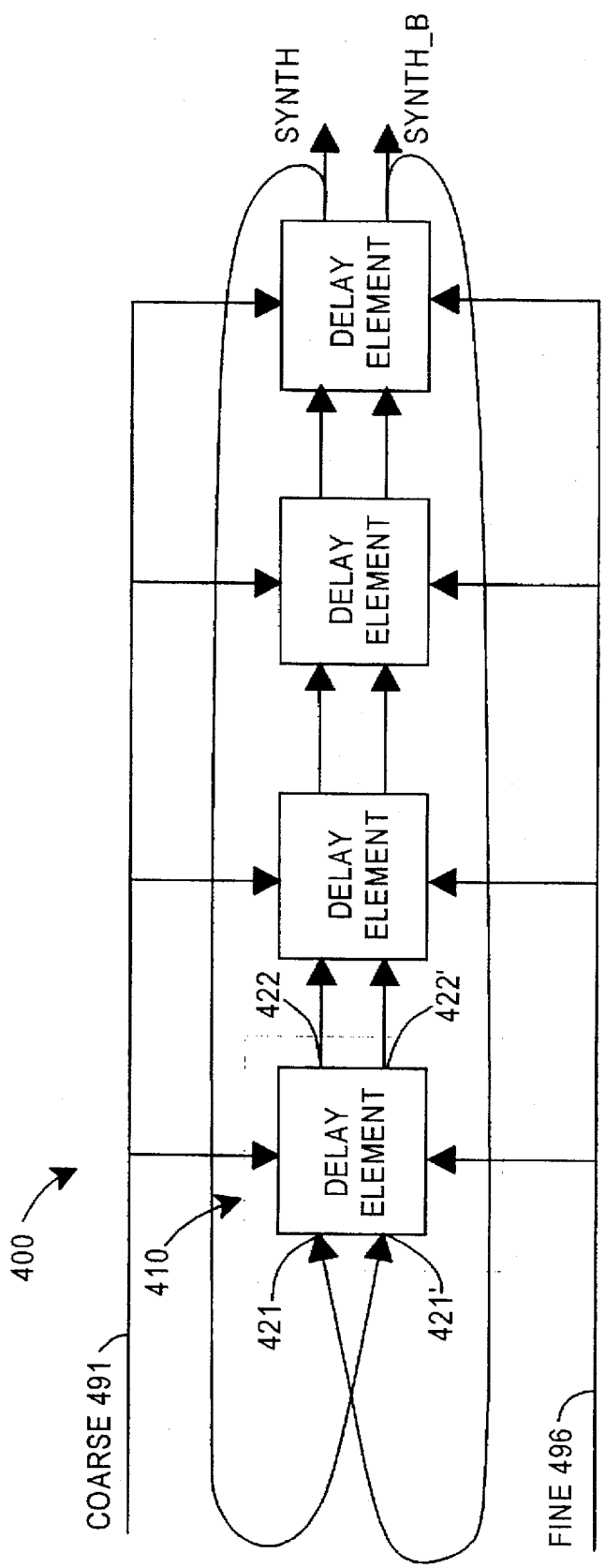
FIG. 4 is a block diagram of a dual-adjust current controlled oscillator in accordance with the present invention.

FIG. 4 depicts a block diagram of a current controlled oscillator in accordance with the present invention. As shown, the current controlled oscillator 400 comprises a series of successively arranged differential delay elements 410, where each delay element is implemented using differential current mode techniques. As shown in FIG. 4, each delay element comprises a delay element input 421, a complemented delay element input 421', a delay element output 422, and a complemented delay element output 422'. The complemented delay element input 421' is the substantial complement of the delay element input 421. Likewise, the complemented delay element output 422' is the substantial complement of the delay element output 422. The delay element output 422 for each delay element is connected to the delay element input 421 of its immediately subsequent delay element in the series of delay elements. The delay element output 422 of the last of the delay elements in the series is connected to the complemented delay element input 421' of the first of the delay elements in the series to form a ring. Likewise, the complemented delay element output 422' for each delay element is connected to the complemented delay element input 421 of its immediately previous delay element in the series of delay elements. The complemented delay element output 422' of the first of the delay elements in the series is connected to the delay element input 421' of the last of the delay elements in the series to form a "ring".

Also shown in FIG. 4, and in accordance with the present invention, there is provided both a coarse adjust control input 491 and a fine adjust control input 496. The coarse adjust control signal 491 provides high gain control in order to select the frequency range of the differential synthesized output signals SYNTH and SYNTH_B. SYNTH_B is the substantial complement of SYNTH.

Because of the differential nature of each delay element, any number of delay elements may be used to provide the outstanding inversion. If an odd number of delay elements are used, the respective delay element output signal 422 and complemented delay element output signal 422' of the last delay element in the ring are used as the respective delay input signal 421 and complemented delay input signal 421' of the first delay element. If an even number of delay elements are used, the respective delay element output signal 422 and complemented delay element output signal 422' of the last delay element in the ring are used as the respective complemented delay input signal 421' and delay input signal 421' of the first delay element.

Figure 5:
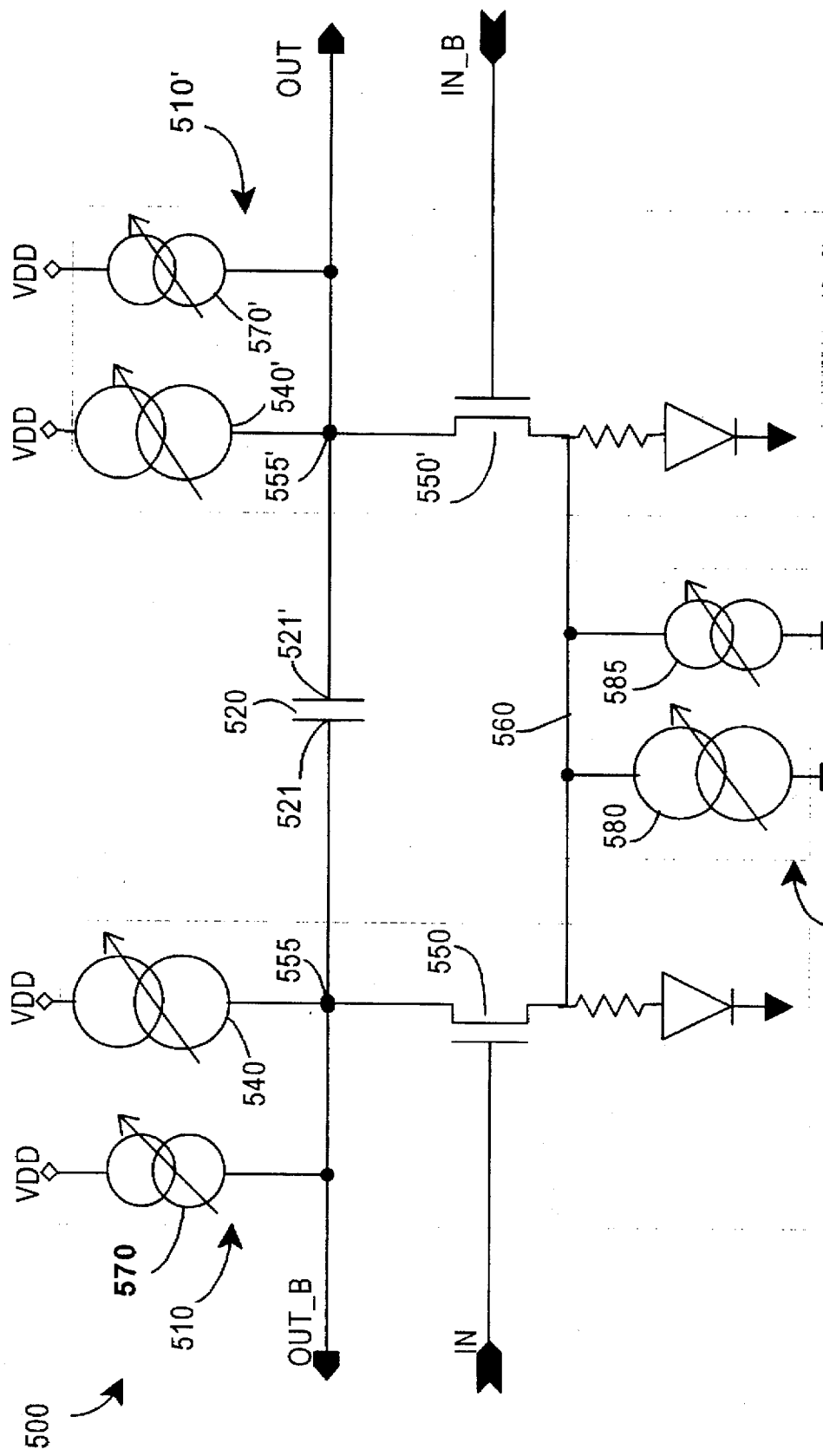
FIG. 5 is a schematic block diagram of a single delay element used in the preferred embodiment of the current controlled oscillator in accordance with the present invention.

FIG. 5 depicts a preferred embodiment of a dual-adjust differential delay element 500 in accordance with the present invention which is used in the ring oscillator 400 of FIG. 4. The typical delay element 500 shown in FIG. 5 comprises a differential amplifier defined by first and second arm circuits 510, 510'. The first and second arm circuits 510, 510' are isolated by a capacitor 520, and coupled to a tail current source 530 via line 560. The capacitor 520 provides the delay factor for the delay element. The differential amplifier receives an input signal IN, and a complemented input signal IN_B which is the substantial complement of input signal IN.

The first arm circuit 510 comprises a first arm coarse current source 540, a first arm fine current source 570, and a first NFET 550. The first arm coarse current source 540 is coupled between a voltage source VDD and a first arm output node 555. The first arm fine current source 570 is also coupled between the voltage source VDD and the first arm output node 555. The first NFET 550 has a drain coupled to the first arm output node 555 and a source coupled to the tail current source 530 on line 560. The first arm coarse current source 540 and the first arm fine current source 570 each allow only a fixed current to flow between the voltage source VDD and first NFET 550. Likewise, the second arm circuit 510' comprises a second arm coarse current source 540', a second arm fine current source 570', and a second NFET 550'. The second arm coarse current source 540' is coupled between a voltage source VDD and a second arm output node 555'. The second arm fine current source 570' is also coupled between the voltage source VDD and the second arm output node 555'. The second NFET 550' has a drain coupled to the second arm output node 555' and a source coupled to the tail current source 530 on line 560. The second arm coarse current source 540' and the second arm fine current source 570' each allow only a fixed current to flow between the voltage source VDD and second NFET 550'. The capacitor 520 is coupled between the first arm output node 555 and the second arm output node 555'.

The tail current source 530 allows only a fixed current to flow between the source of the NFET 550, 550' and ground. The tail current source 530 provides a common-mode gain that is essentially zero, which results in a desirable high common-mode rejection ratio (CMRR).

In accordance with the present invention, each of the first arm coarse and fine, second arm coarse and fine, and tail coarse and fine current sources are controllable. Each of the coarse current sources 540, 540' and 580, have a coarse adjust input 590 by which a coarse adjust signal 591 can adjust the amount of fixed current. Likewise, each of the fine current sources 570, 570' and 585, have a fine adjust input 595 by which a fine adjust signal 596 can adjust the amount of current. The coarse current sources 540, 540' and 580 have a high gain such that a small change in the amount of current flow results in a large change in frequency of the output signals OUT and OUT_B. The fine current sources 570, 570 and 585 have a low gain such that a large change in the amount of current flow results in a small change in frequency of the output signals OUT and OUT_B. In the preferred embodiment, the gain of the coarse current sources 540, 540' and 580 is 100 times the gain of the fine current sources 570, 570' and 585. In addition, in the preferred embodiment, each of the coarse current sources 540, 540' and 580, and each of the fine current sources 570, 570' and 585, have separate control inputs such that each may be adjusted separately by separate and distinct input control signals.

The gate of first NFET 550 of the first arm circuit 510 is connected to receive input signal IN, while its corresponding output signal OUT is produced at second arm output node 555' of the second arm circuit 510'. Likewise, the gate of second NFET 550' of the second arm circuit 510' is connected to receive the complemented input signal IN_B, while its corresponding output signal OUT_B is produced at output node 555 of the first arm circuit 510. In the delay element differential amplifier 500, it is important that the first and second NFETs 550 and 550' be electrically matched, having nearly identical threshold voltages, both to each other and to the first and second NFETs of every other delay element.

The operation of the delay element 500 is as follows. This discussion begins with the initial assumption that input signal IN is high and complemented input signal IN_B is low. When IN_B is low, the gate-to-source voltage VGS of second NFET 550' will not exceed the threshold voltage of second NFET 550', and no current will flow between the source and drain of second NFET 550'. However, with IN high, the gate-to-source voltage VGS of first NFET 550 will exceed the threshold voltage of first NFET 550 to the point of saturation, thereby causing all the current to flow between the source and drain of first NFET 550 and thus through the first arm circuit 510. This causes the voltage level of complemented output signal OUT_B at first arm output node 555 of first arm circuit 510 to be of lower magnitude than the voltage level of output signal OUT at second arm output node 555' of second arm circuit 510'. (Note: The combined current flowing through both of the arm circuits 510 and 510' is limited to the amount of current of the tail current source 530. In the preferred embodiment, the first and second arm current sources 510 and 510' have a quiescent current value of 2 mA, and the tail coarse current source has a quiescent current value of 4 mA. The voltage on line 560 will vary to keep the combined tail current of the tail coarse current source and the tail fine current source nearly constant.)

Since OUT of the subject delay element becomes the input signal IN of the subsequent delay element, a high voltage level on IN causes the gate-to-source voltage VGS of the first NFET 550 of the subsequent delay element to exceed the threshold voltage, causing current to flow through the first arm circuit 510 of the subsequent delay element. This causes the output signal OUT of the subsequent delay element to go high. Then, since OUT of the subsequent delay element becomes IN to the next subsequent delay element, it will cause the output signal OUT of the next subsequent delay element to go high. In a continuing manner, the original high signal on IN is propagated through the delay elements to the last delay element in the ring. The low IN_B signal is propagated through the delay elements simultaneously in a similar manner. The oscillation is provided by an outstanding inversion (either through an odd number of delay elements and no signal cross-over, or through an even number of delay elements and a signal cross-over as heretofore described) which is fed back to the first delay element in the ring. This process continuously repeats, creating a voltage oscillation on the differential output signals OUT and 0UT_B.

Because the capacitor 520 is coupled between output nodes 555 and 555', the capacitor will charge and discharge in relation to the change in voltage potential between the output signals OUT and OUT_B. The capacitor 520 introduces a time constant which determines how quickly the output signals at OUT and OUT_B change with respect to a change in input signal at IN and IN_B. Thus, the rate of oscillation is caused by the signal delay and may be controlled by the size of the capacitor 520. However, in accordance with the present invention, the oscillating frequency is controlled by controlling the amount of current supplied by each current source via the coarse and fine adjust signals 591, 596.

Using the operating principles of the differential delay element just discussed, the functionality of the coarse and fine adjust inputs may now be understood. Since the gain of the coarse current sources 540, 540' and 580, are significantly higher than the gain of the fine current sources 570, 570' and 585, the coarse adjust signal 591 will determine the range of the oscillating frequency. Then, within the selected range, the fine adjust signal 596 may adjust the frequency up and down within the selected range to manipulate the oscillating frequency without resulting in range switching.

Figure 6:
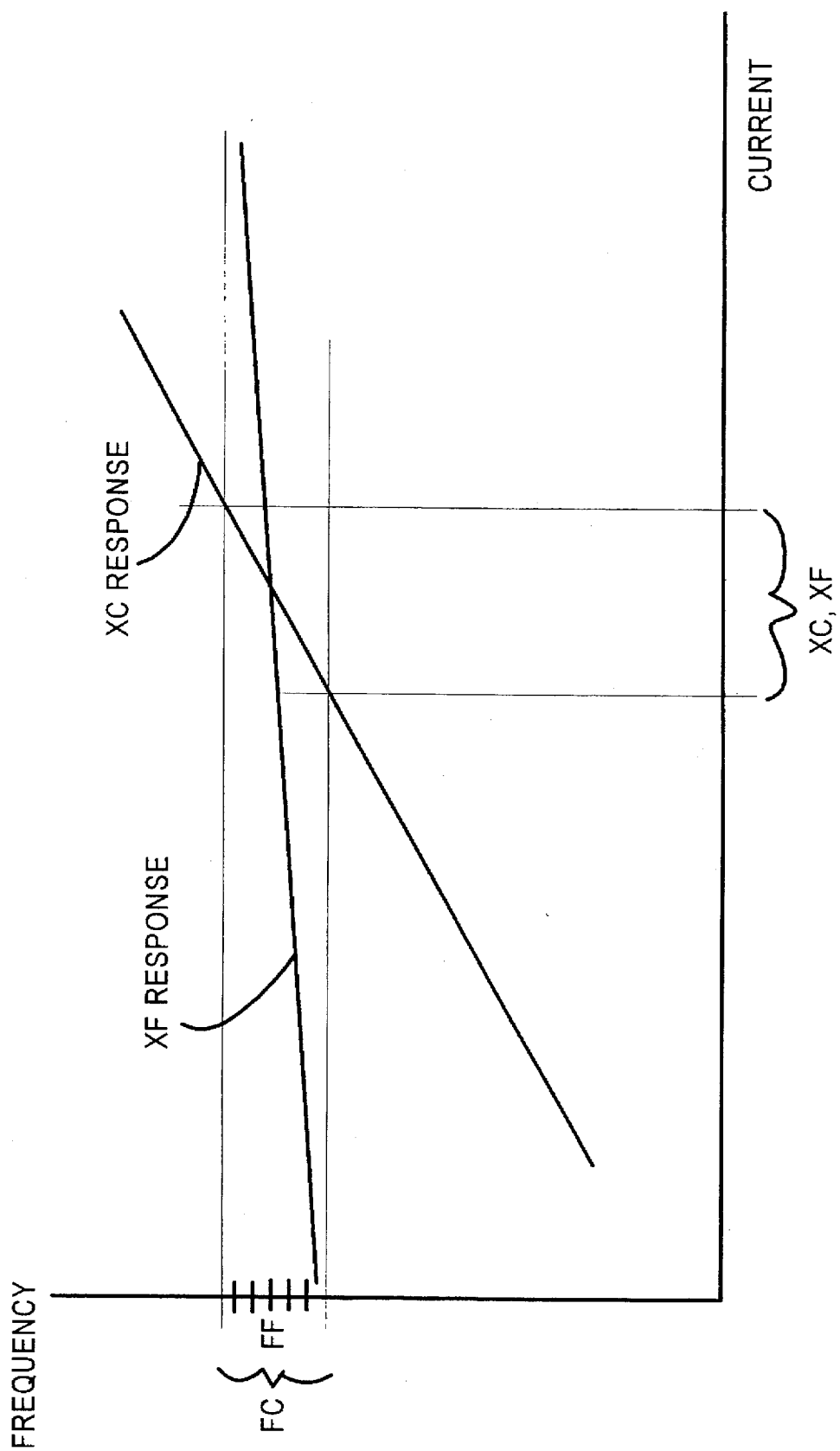
FIG. 6 is a current vs. frequency plot illustrating the advantages of the multiple-gain frequency acquisition provided by the present invention.

The inventive concept may be better understood in light of FIG. 6, which depicts a Current vs. Frequency plot. As shown in FIG. 6, the coarse signal response $X_C$ has a large slope; thus, a single step by the coarse adjust signal results in a large change in frequency. The fine adjust signal response $X_F$ has much smaller slope; a single step by the fine adjust signal results in a much smaller change in frequency. Thus, the coarse adjust signal sets a frequency range $F_C$. Within the frequency range $F_C$, a fine adjust signal may take multiple steps $X_F$ to manipulate the oscillating frequency up or down, while remaining within the coarse frequency range $F_C$ set by the coarse adjust signal, and without causing the frequency range to switch. In the preferred embodiment, the fine adjust signal has 100 steps of freedom within a range of frequency set by the coarse adjust signal.

With reference to FIG. 5, the multiple gain frequency synthesizer is achieved by the coarse and fine current sources. Thus, in accordance with the operating principles above described, the coarse adjust signal 591 adjusts the amount of current supplied by the coarse current sources 540, 540' and 580 until the oscillating frequency comes within desired frequency range. When this occurs in a phase locked loop, the signal is said to be "locked". With the coarse adjust signal 591 set to the desired frequency range, the fine adjust signal 595 adjusts the amount of current supplied by the fine current sources 570, 570' and 585 to adjust the oscillating frequency up or down within the frequency range set by the coarse adjust signal to compensate for frequency drifts caused by tracking or changes in temperature.

Figure 7:
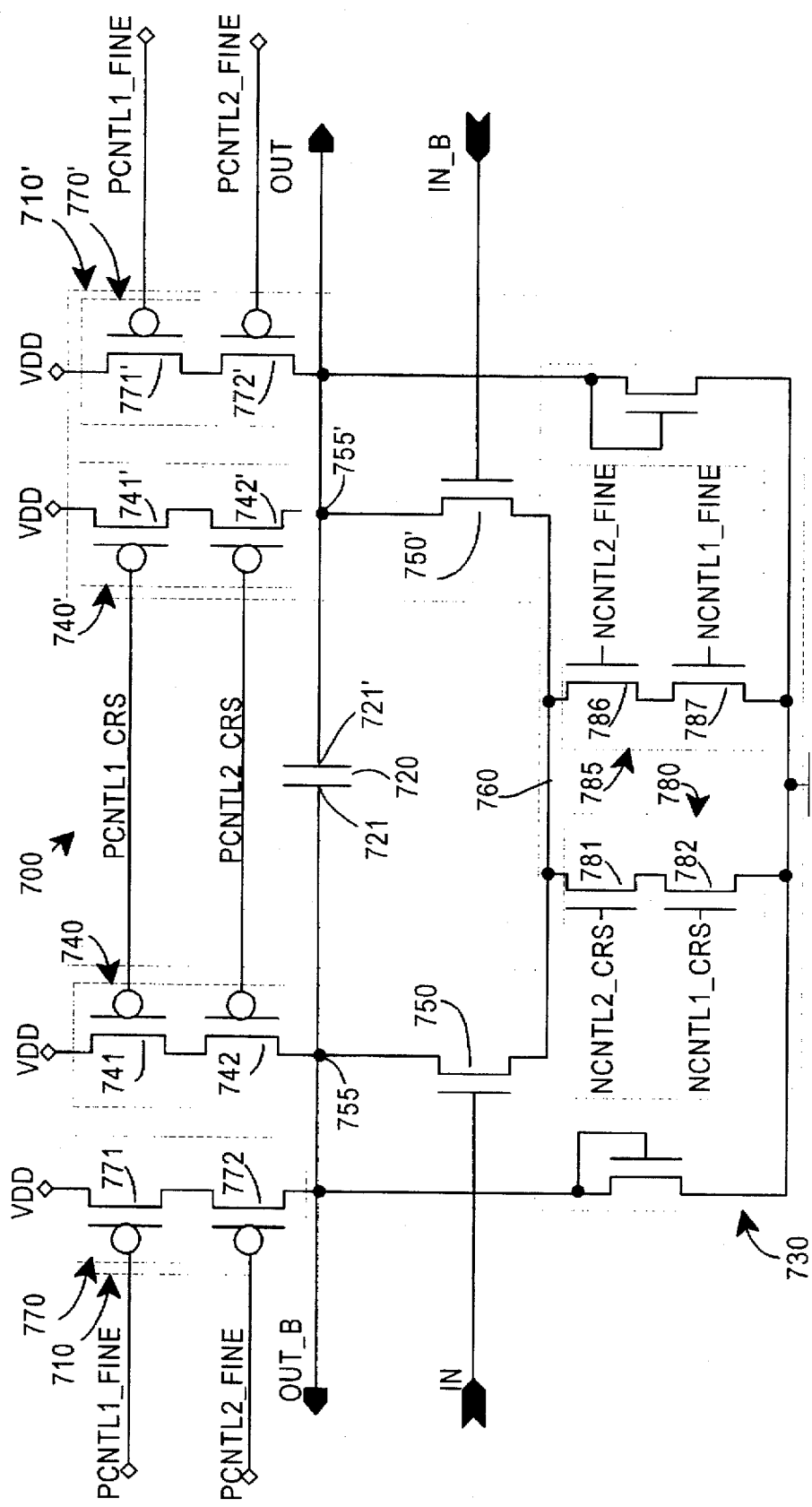
FIG. 7 is a schematic diagram of the preferred embodiment delay element for the dual adjust current controlled oscillator shown in FIG. 5.

FIG. 7 shows a more detailed schematic of the preferred embodiment of a dual-adjust differential delay element 500 shown in FIG. 5, and used in the dual-adjust current controlled oscillator contemplated by the present invention. The structure of the dual-adjust differential delay element 700 corresponds directly to the structure of the dual-adjust differential delay element shown in FIG. 5. Thus, for convenience, the numbering of the two least significant digits of the reference numerals in FIG. 7 corresponds directly to the numbering of the two least significant digits of the reference numerals in FIG. 5. As shown in FIG. 7, the dual-adjust differential delay element 700 comprises a first arm circuit 710 and a second arm circuit 710'. The first and second arm circuits 710 and 710' are isolated by a capacitor 720, and coupled to a tail current source 730 via line 760. The differential amplifier receives an input signal IN at the gate of first NFET 750, and produces an output signal OUT at second arm output node 755'. The differential amplifier also receives a complemented input signal IN_B which is the substantial complement of input signal IN, and produces an output signal OUT_B at first arm output node 755.

The first arm circuit 710 comprises a first arm coarse current source 740, a first arm fine current source 770, and the first NFET 750. The first arm coarse current source 740 is coupled between a voltage source VDD and the first arm output node 755. The first arm fine current source 770 is also coupled between the voltage source VDD and the first arm output node 755. The first NFET 750 has a drain coupled to the first arm output node 755 and a source coupled to the tail current source 730 on line 760. Likewise, the second arm circuit 710' comprises a second arm coarse current source 740', a second arm fine current source 770', and a second NFET 750'. The second arm coarse current source 740' is coupled between a voltage source VDD and a second arm output node 755'. The second arm fine current source 770' is also coupled between the voltage source VDD and the second arm output node 755'. The second NFET 750' has a drain coupled to the second arm output node 755', and a source coupled to the tail current source 730 on line 760.

As shown in FIG. 7, the first arm coarse current source 740 comprises a pair of electrically matched PFETs 741 and 742 arranged in a drain-source relationship and coupled between the voltage source VDD and first arm output node 755. The first arm fine current source 770 also comprises a pair of electrically matched PFETs 771 and 772 arranged in a drain-source relationship and coupled between the voltage source VDD and first arm output node 755. However, the size of the first arm coarse current source PFETs 741, 742 is much greater than the size of the fine current source PFETs 771, 772. The PFET size difference provides high gain control through the first arm coarse current source 740 and low gain control through the first arm fine current source 770. The second arm coarse current source 740' correspondingly comprises a pair of electrically matched PFETs 741', 742' arranged in a drain-source relationship and coupled between the voltage source VDD and second arm output node 755'. Likewise, the second arm fine current source 770' also correspondingly comprises a pair of electrically matched PFETs 771' 772' arranged in a drain-source relationship and coupled between the voltage source VDD and second arm output node 755'. Similarly, the size of the second arm coarse current source PFETs 741', 742' is much greater than the size of the second arm fine current source PFETs 771', 772' in order to provide high gain and low gain control. It is also important that each of the first and second arm coarse current source PFETs 741, 742, 741' and 742' be electrically matched to each other, and that each of the first and second arm fine current source PFETs 771, 772, 771' and 772' be electrically matched to each other.

The structure of the tail current source 730 is similar to the structure of the first and second arm current sources. The tail current source 730 comprises a tail coarse current source 780 comprising a pair of electrically matched NFETs 781 and 782 arranged in a drain-source relationship and coupled between line 760 and ground. The tail current source 730 also comprises a tail fine current source 785 comprising a pair of electrically matched NFETs 786 and 787 arranged in a drain-source relationship and coupled between line 760 and ground. As with the first and second arm current sources, the size of the tail coarse current source NFETs 781 and 782 is much greater than the size of the tail fine current source NFETs 786 and 787 in order to provide high gain and low gain control of the oscillating frequency.

As shown in FIG. 7, control of the current sources is managed by controlling the gate-to-source voltage of each of the coarse and fine current source PFETs 741, 742, 741', 742' and 771, 772, 771', 772' and coarse and fine current source NFETs 781,782, 786 and 787. Thus, as shown in FIG. 7, the first and second arm upper coarse current source PFETs 741 and 741 each receive an upper coarse PMOS control signal PCNTL2_CRS, and the first and second arm lower coarse current source PFETs 742 and 742 each receive a lower coarse PMOS control signal PCNTL2_CRS. The first and second arm coarse control signals PCNTL1_CRS and PCNTL2_CRS control the gate-to-source voltage VGS of their respective PFETs, which determines the amount of current supplied by the first and second arm coarse current sources 740, 740'. Likewise, the first and second arm upper fine current source PFETs 771 and 771' each receive an upper fine PMOS control signal PCNTL1_FINE, and the first and second arm lower fine current source PFETs 772 and 772' each receive a lower fine PMOS control signal PCNTL2_FINE. The first and second arm fine control signals PCNTL1_FINE and PCNTL2_FINE control the gate-to-source voltage VGS of their respective PFETs, which determines the amount of current supplied by the first and second arm fine current sources 770, 770'.

Similarly, the lower tail coarse current source NFET 782 receives a lower tail coarse NMOS control signal NCNTL1_CRS, and the upper tail coarse current source NFET 781 receives an upper tail coarse NMOS control signal NCNTL2_CRS. The tail coarse control signals NCNTL1_CRS and NCNTL2_CRS control the gate-to-source voltage VGS of their respective NFETs, which determines the amount of current supplied by the tail coarse current source 780. Likewise, the lower tail fine current source NFET 787 receives a lower fine NMOS control signal NCNTL1_FINE, and the tail fine current source NFET 787 receives an upper fine PMOS control signal NCNTL2_FINE. The tail fine control signals NCNTL1_FINE and NCNTL2_FINE control the gate-to-source voltage VGS of their respective NFETs, which determines the amount of current supplied by the tail fine current source 785.

Figure 8:
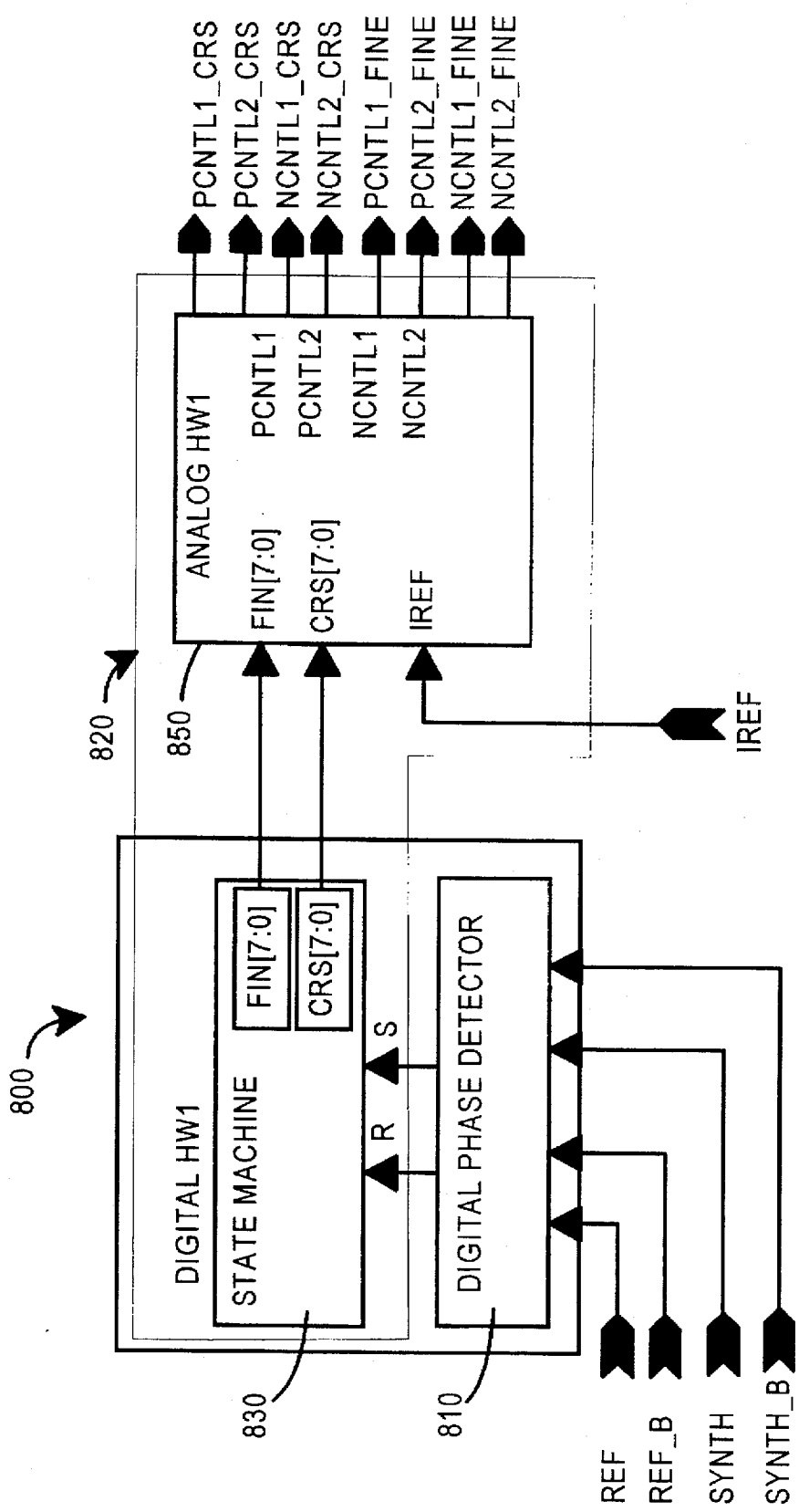
FIG. 8 is a block diagram of a preferred embodiment of a hybrid digital/analog controller in accordance with the present invention.

FIG. 8 shows a block diagram of a preferred embodiment of a phase detector 810 and controller 820 in accordance with the present invention. It will be appreciated by one skilled in the art that the phase detector may be implemented using either analog or digital techniques, and that the controller 820 may embody any of various means to adjust the coarse and fine control signals and to provide automatic switching between the coarse and fine adjust control inputs of the dual-adjust current controlled oscillator. As shown in FIG. 8, the preferred embodiment of the phase detector 810, implemented using digital techniques, receives and monitors the edges of the differential reference signal REF and REF_B and the differential synthesized signal SYNTH and SYNTH_B from the dual-adjust current controlled oscillator. The digital phase detector 810 monitors the edges of the input signals REF and REF_B, and SYNTH and SYNTH_B to determine which edge came first. It provides two output lines labeled R and S. The R output signal is true when the reference signal edge is received first, and the S output signal is true when the synthesized signal edge is received first. Both output signals R and S are true when the signal edges are received at approximately the same time. Appendix A contains a Verilog module, labeled PFSYNCHhw6, which implements the digital phase detection.

The preferred embodiment of the controller 820 shown in FIG. 8 is a hybrid digital/analog controller which comprises a digital control block 830 and an analog control block 850. The digital control block 900, shown in FIG. 9, of the preferred embodiment of the controller 820 is implemented with a digital state machine 830 which receives the R and S signals from the digital phase detector 810, and which provides a coarse adjust signal CRS, and a fine adjust signal FIN. The digital state machine 900 generally operates to monitor the phase error information (i.e., the R and S signals) from the digital phase detector 810, to achieve signal lock (or near-lock) by generating coarse adjust signal CRS which will be manipulated by the analog control block 850 to control the coarse adjust input of the dual-adjust current controlled oscillator. Once lock is achieved, the digital state machine 900 automatically switches to generate a fine adjust signal FIN which will also be manipulated by the analog control block to control the fine adjust input of the dual-adjust current controlled oscillator.

Figure 9:
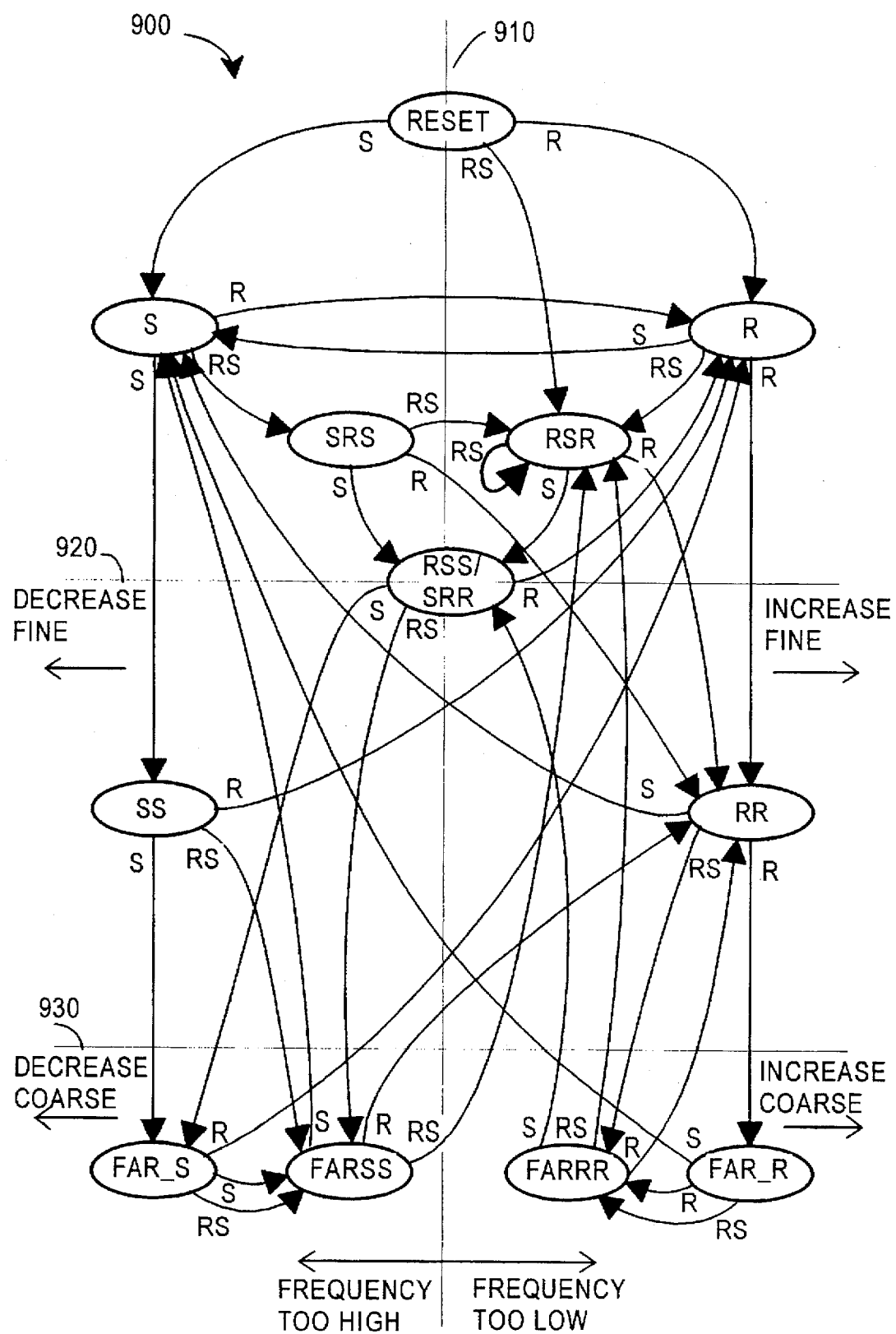
FIG. 9 is a state diagram of the preferred embodiment of the digital portion of the hybrid digital/analog controller in accordance with the present invention.

FIG. 9 shows a diagram of the state machine 900 used to implement the digital control block 830 of FIG. 8 for controlling the coarse and fine adjust signals generated for input to the dual-adjust current controlled oscillator of the present invention. The state machine shown in FIG. 9 is a pattern detector which operates on principles of pulse analysis. Based upon the pattern of the signal edges R and S received, the digital state machine determines whether to adjust the coarse or the fine adjust signal, and in which direction, or whether to make no adjustment at all. In FIG. 9, an "R" means that an edge from the differential reference signal REF, REF_B was latched, an "S" means that an edge from the synthesized signal SYNTH, SYNTH_B was latched, and an "RS" means that an R and an S edge were both latched. In the state machine diagram of FIG. 9, the states are separated by three dotted lines—direction delimiter 910, fine adjust delimiter 20, and coarse adjust delimiter 930.

As shown in FIG. 9, if the present state is above the fine adjust delimiter 920 (i.e., states RESET, S, R, SRS, RSR or RSS), no adjustment need be made in either direction to either the fine adjust signal FIN or the coarse adjust signal CRS. Thus they can remain at their current settings.

If the present state is between the fine adjust delimiter 920 and the coarse adjust delimiter 930 (i.e., state SS or state RR), an adjustment must be made to the fine adjust signal FIN. The direction of adjustment is determined by which side of the direction delimiter 910 the state is on. Thus, if the present state is SS to the left of the direction delimiter 910, the frequency is too high, and the fine adjust control FIN needs to be adjusted to decrease the frequency. If, however, the present state is RR to the right of the direction delimiter 910, the frequency is too low, and the fine adjust control FIN needs to be adjusted to increase the frequency.

If the present state is below the coarse adjust delimiter 930 (i.e., states FAR_S, FARSS, FARSR or FAR_R), an adjustment must be made to the coarse adjust signal CRS. The direction of adjustment is determined by which side of the direction delimiter 910 the state is on. Thus, if the present state is FAR_S or FARSS to the left of the direction delimiter 910, the frequency is too high, and the coarse adjust signal CRS needs to be adjusted to decrease the frequency. If, however, the present state is FARSR or FAR_R to the right of the direction delimiter 910, the frequency is too low, and the coarse adjust signal CRS needs to be adjusted to increase the frequency. Signals FAR_S, FAR_R, FARSS and FARSR act on two digital registers FIN and CRS (the equivalent of capacitors used to store voltage). The register values of FIN and CRS are increased and decreased by the state machine 830. The analog converter block 850 receives the digital register values FIN and CRS, and converts them to analog currents to produce the right frequency. Appendix A contains a Verilog implementation, labeled PFPHAhw7, of the state machine 900 shown in FIG. 9.

In summary, the foregoing detailed description presents a dual-adjust current-controlled phased locked loop. The phase locked loop of the present invention employs a dual-adjust current-controlled oscillator which is responsive to a coarse adjust signal and fine adjust signal for providing multiple-gain frequency acquisition, and a controller responsive to phase error information which provides automatic adjustment, and switching between, the coarse adjust control and fine adjust control of the dual-adjust current-controlled phase locked loop. Thus, the dual-adjust current-controlled phase locked loop of the present invention allows for faster range switching time without causing excessive clock jitter and for minimizing the noise impact on the clock jitter.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

APPENDIX A:

DIGITAL PHASE DETECTOR AND STATE MACHINE MODEL AS IMPLEMENTED IN VERILOG®

```
//#########################################
//
// PFSYNChw6 -- Synchronizer for tc_r (f_ref divided by M).
//
// Copyright 1993 Hewlett-Packard Company.  All Rights Reserved.
//
//######################################### timescale 1ns / 10ps module PFSYNChw6 ( R_sync1, R_sync2, Dolt, f_o, tc_r, resetn );

input       f_o;        // oscillator output
        input       tc_r;       // M-cntr TC
        input       resetn;     // reset
        output      R_sync1;    // tc_r synchronized to f_o
        output      R_sync2;    // tc_r synchronized to ~f_o
        output      Dolt;       // R_sync1 delayed by 4 clocks //#########################################
//
// Synchronizer
//
//######################################### reg         clean_r, clean_r1;
        reg         R_sync1, R_sync2;
        reg         [2:0] count;

// Capture the asynchronous terminal count output of the f_ref divider.

always @(posedge f_o or negedge resetn) begin
                if (! resetn )
                        clean_r1 <= #1 0;
                else
```

```
                    clean_r1 <= #1 tc_r;
    end

/* add a second flip-flop to synchronize better */
    always @(posedge f_o or negedge resetn) begin
            if (! resetn )
                    clean_r1 <= #1 0;
            else
                    clean_r1 <= #1 clean_r1;
    end /* emit one pulse when triggered
    always @(posedge f_o or negedge resetn) begin
            if (! resetn)
                    R_sync1 <= #1 0;
            else if ( clean_r && R_sync1 == 0 && count == 0 )
                    R_sync1 <= #1 1;
            else
                    R_sync1 <= #1 0;
    end;

// count up when triggered
    always @(posedge f_o or negedge resetn) begin
            if (! resetn)
                    count <= #1 0;
            else if ( R_sync1 )
                    count <= #1 1;
            else if ( count > 0 && count < 5)
                    count <= #1 count+1;
            else if ( ~clear_r )
                    count <= #1 0;
            else if (count == 5 )
                    count <= #1 5;
                    R_sync1 <= #1 1;
            else
```

H.P. Docket No.: 10950200-1       - 30 -

```
                count <= #1 0;
    end;

// after waiting a while, output an action pulse
assign DoIt = count[2];

// R_sync2 is R_sync1 delayed by half a clock phase
always @(posedge f_o or negedge resetn) begin
        if (! resetn)
                R_sync2 <= #1 0;
        else
                R_sync2 <= #1 R_sync1;
end endmodule
```

```
//##########################################
//
// PFPHAhw7 -- Phasor rotation detector.
//
// This behaviour block implements a state machine to control the frequency
// accumulator.
//
// Copyright 1992 Hewlett-Packard Company.  All Rights Reserved.
//
//########################################## timescale 1ns / 10ps module PFPHAhw7 (dir, Zsel, trueN, add1, far, Rfreq, Rsync, Ssync, resetn);

output    dir;
        output    Zsel;
        output    trueN;
        output    add1;
        output    far;
        input     Rfreq;
        input     Rsync;
        input     Ssync;
        input     resetn;

wire      [1:0] Rsedge;
        wire      add1, trueN;
        wire      Rz;

reg       Zsel, dir, far, Rx, Sx, sact;
        reg       iZsel, idir, ifar;

// Complete this phase_state table.  Remember to include enumeration
// information so that you'll be able to extract a phase_state table
```

```
Parameter [3:0] /* synopsys enum phase_states */
    RESET  = 4'd0,
    S      = 4'd1,
    R      = 4'd2,
    SS     = 4'd3,
    RR     = 4'd4,
    SRS    = 4'd5,
    RSR    = 4'd6,
    RSS    = 4'd7,
    FAR_R  = 4'd8,
    FAR_S  = 4'd9,
    FARSR  = 4'd10,
    FARSS  = 4'd11;

// synopsis state_vector phase_state reg [3:0]    phase_state, next_phase_state; /* synopsis enum phase_states */

// This defines the four input phase_states of Rsedge parameter [1:0]
    NOP   = 2'd0      // No Operation => no edges
    SED   = 2'd1      // S Edge. An edge from the synthsizer was latched.
    RED   = 2'd2      // R Edge. An edge from the reference was latched.
    RSED  = 2'd3      // Both R and S Edges latched.

Assign Rsedge = (Rsync, Ssync);

// State transition definition always @ ( Rsedge or phase_state ) begin
    case (phase_state)        // synopsys full_case parallel_case
        RESET: begin
            case (Rsedge) //synopsys full_case parallel_case
                NOP : next_phase_state = RESET;// No info, do nothing
```

```
            SED: next_phase_state = S;
            RSED: next_phase_state = RSR;
            RED: next_phase_state = R;   // Just go to SR
        endcase
    end
    S: begin
        case (Rsedge) //synopsys full_case parallel_case
            NOP : next_phase_state = S;// No info, do nothing
            SED: next_phase_state = SS;
            RSED: next_phase_state = SRS;
            RED: next_phase_state = R;   // Just go to SR
        endcase
    end
    R: begin
        case (Rsedge) //synopsys full_case parallel_case
            NOP : next_phase_state = R;// No info, do nothing
            SED: next_phase_state = S;
            RSED: next_phase_state = RSR;
            RED: next_phase_state = RR;// Just go to SR
        endcase
    end
    RSR: begin
        case (Rsedge) //synopsys full_case parallel_case
            NOP : next_phase_state = RSR;// No info, do nothing
            SED: next_phase_state = RSS;
            RSED: next_phase_state = RSR;
            RED: next_phase_state = RR; // Just go to SR
        endcase
    end
    RSS: begin
        case (Rsedge) //synopsys full_case parallel_case
            NOP : next_phase_state = RSS;// No info, do nothing
            SED: next_phase_state = FAR_S;
            RSED: next_phase_state = FARSS;
            RED: next_phase_state = R;   // Just go to SR
```

```
        endcase
    end
    SRS: begin
        case (Rsedge) //synopsys full_case parallel_case
            NOP : next_phase_state = SRS;// No info, do nothing
            SED: next_phase_state = RSS;
            RSED: next_phase_state = RSR;
            RED: next_phase_state = RR;
        endcase
    end
    SS: begin
        case (Rsedge) //synopsys full_case parallel_case
            NOP : next_phase_state = SS;// No info, do nothing
            SED: next_phase_state = FAR_S;
            RSED: next_phase_state = FARSS;
            RED: next_phase_state = R;
        endcase
    end
    RR: begin
        case (Rsedge) //synopsys full_case parallel_case
            NOP : next_phase_state = RR;// No info, do nothing
            SED: next_phase_state = S;
            RSED: next_phase_state = FARSR;
            RED: next_phase_state = FAR_R;
        endcase
    end
    FAR_S: begin
        case (Rsedge) //synopsys full_case parallel_case
            NOP : next_phase_state = FAR_S;// No info, do nothing
            SED: next_phase_state = FAR_S;
            RSED: next_phase_state = FARSS;
            RED: next_phase_state = R;
        endcase
    end
    FAR_R: begin
```

```
            case (Rsedge) //synopsys full_case parallel_case
                NOP : next_phase_state = FAR_R;// No info, do nothing
                SED: next_phase_state = S;
                RSED: next_phase_state = FARSR;
                RED: next_phase state = FAR_R;
            endcase
        end
        FARSS: begin
            case (Rsedge) //synopsys full_case parallel_case
                NOP : next_phase_state = FARSS;// No info, do nothing
                SED: next_phase_state = S;
                RSED: next_phase_state = RSR;
                RED: next_phase_state = RR;
            endcase
        end
        FARSR: begin
            case (Rsedge) //synopsys full_case parallel_case
                NOP : next_phase_state = FARSR;// No info, do nothing
                SED: next_phase state = RSS;
                RSED: next_phase_state = RSR;
                RED: next_phase_state = RR;
            endcase
        end // We're lost: try to get back to something reasonable.

Default: next_phase_state = RESET;
        endcase
    end

// Generate the intermediate output based on the current state. Note that the
// actual outputs are delayed in time.

// Add "0" to n_count2 - n_count1 (rather than (N+1) or -(N+1)).
```

```
always @ (phase_state) begin
    case (phase_state)
        SS, SRS, RR  : iZsel = 1'b0;
        default      : iZsel = 1'b1;
    endcase
end // If the phasor has gone around more than once, se're far from the target
// frequency.
always @ (phase_state) begin
    case (phase_state)
        FAR_R, FAR_S, FARSS, FARSR   : ifar = 1'b1;
        default                      : ifar = 1'b0;
    endcase
end // If far == 1, then output the direction to change the frequency.
always @ (phase_state) begin
    case (phase_state)
        R, RR, RSR, FAR_R, FARSR  : idir = 1'b0;
        default                   : idir = 1'b1;
    endcase
end // Delay Zsel, far and dir in time: update the outputs if Rz == 1.

always @ ( posedge Rfreq or negedge resetn ) begin
    if ( ! resetn)
        Zsel = #1 1'b0;
    else
        if (Rz)
            Zsel = #1 iZsel;
        else
            Zsel = #1 Zsel;
end
```

```
always @ ( posedge Rfreq or negedge resetn ) begin
    if ( ! resetn)
        far = #1 1'b0;
    else
        if (Rz)
            far = #1 ifar;
        else
            far = #1 far;
end
always @ ( posedge Rfreq or negedge resetn ) begin
    if ( ! resetn)
        dir = #1 1'b0;
    else
        if (Rz)
            dir = #1 idir;
        else
            dir = #1 dir;
end // add1 assign add1 = dir & ~Zsel;
assign trueN = dir;

always @ (phase_state) begin
    case (phase_state)
        FAR_S, FARSS, SS   : sact = 1'b1;
        default            : sact = 1'b0;
    endcase
end // Delay sact by one Rfreq clock cycle.

always @ ( posedge Rfreq or negedge resetn ) begin
    if ( ! resetn)
```

```
                Sx = #1 1'b0;
        else
                Sx = #1 sact;
end // Delay Rsync by one Rfreq clock cycle.

always @ ( posedge Rfreq or negedge resetn ) begin
        if ( ! resetn)
                Rx = #1 1'b0;
        else
                Rx = #1 Rsync;
end // Rz causes Zsel, dir and far to be delayed one Rfreq clock cycle.

Assign Rz = sact | (~Sx & Rx);

// Update the phase state register.

always @ (posedge Rfreq or negedge resetn ) begin
        if ( ! resetn)
                phase_state = #1 RESET;
        else
                phase_state = #1 next_phase_state;
end endmodule
```

What is claimed is:

1. A dual-adjust current controlled oscillator, comprising:

one or more delay elements arranged in a ring to produce an oscillating output signal, each delay element producing an output signal at a first output node and a complemented output signal at a second output node, and each delay element being responsive to an input signal at a first input node, a complemented input signal at a second input node, each delay element comprising a high gain current source directly coupled to said first output node and said second output node, said high gain current source coupled to receive a coarse adjust control signal for controlling a frequency range level of an oscillating frequency range of the output signal and the complemented output signal, and each delay element comprising a low gain current source directly coupled to said first output node and said second output node, said low gain current source coupled to receive a fine adjust control signal for controlling a frequency of the output signal and complemented output signal, said frequency being within the oscillating frequency range.

2. The current-controlled oscillator of claim 1, each delay element comprising a first arm amplifier circuit comprising a first coarse variable current source responsive to the coarse adjust control signal and coupled between a voltage source and the second output node, a first fine variable current source responsive to the fine adjust control signal and coupled between the voltage source and the second output node, and a first switch responsive to the input signal and coupled between the second output node and an internal node;

a second arm amplifier circuit comprising a second coarse variable current source responsive to the coarse adjust control signal and coupled between a voltage source and the first output node, a second fine variable current source responsive to the fine adjust control signal and coupled between the voltage source and the first output node, and a second switch responsive to the complemented input signal and coupled between the first output node and the internal node;

a tail circuit comprising a tail coarse variable current source responsive to the coarse adjust control signal and a tail fine variable current source responsive to the fine adjust control signal, the tail coarse variable current source and the tail fine variable current source each coupled between the internal node and a circuit ground;

and a capacitor coupled between the first output node and the second output node.

3. The current controlled oscillator of claim 2, wherein the first coarse variable current source, the second coarse variable current source, and the tail coarse variable current source each have a higher gain than each of the first fine variable current source, the second fine variable current source and the tail fine variable current source.

4. The current controlled oscillator of claim 3, wherein:

the respective first and second coarse variable current sources each comprise a plurality of high gain FETs coupled in source-drain relationship between the voltage source and the respective first and second output nodes, the gate of each high gain FET coupled to receive the coarse adjust control signal;

the respective first and second fine variable current sources each comprise a plurality of low gain FETs coupled in source-drain relationship between the voltage source and the respective first and second output nodes, the gate of each low gain FET coupled to receive the fine adjust control signal;

the tail coarse variable current source comprising a plurality of tail high gain FETs coupled in source-drain relationship between the internal node and the circuit ground, the gate of each of the plurality of tail high gain FETs coupled to receive the coarse adjust control signal; and the tail fine variable current source comprising a plurality of tail low gain FETs coupled in source-drain relationship between the internal node and the circuit ground, the gate of each tail low gain FETs coupled to receive the fine adjust control signal.

5. The current controlled oscillator of claim 4, the first switch comprising a first FET having a gate coupled to the first input node, a drain coupled to the second output node, and a source coupled to the internal node, and the second switch comprising a second FET having a gate coupled to the second input node, a drain coupled to the first output node, and a source coupled to the internal node.

6. A method for controlling a dual-adjust current-controlled oscillator, the dual-adjust current-controlled oscillator responsive to a coarse adjust control signal for controlling a range level of an oscillating frequency range and a fine adjust control signal for producing a synthesized signal having an oscillating frequency within the oscillating frequency range, the method comprising the steps of:

(a) comparing the synthesized signal with a reference signal;

(b) generating the coarse adjust control signal and the fine adjust control signal, the coarse adjust control signal reflecting a coarse magnitude and a coarse direction for controlling the range level of the oscillating frequency range and for providing high gain regulation of the oscillating frequency of the synthesized signal, and the fine adjust control signal reflecting a fine magnitude and a fine direction for providing low gain regulation of the oscillating frequency of the synthesized signal.

7. The method of claim 6, step (b) further comprising the steps of:

(c) adjusting the coarse adjust control signal in a first direction to decrease the range level the oscillating frequency range when the synthesized signal leads the reference signal by a frequency greater than a coarse adjust threshold;

(d) adjusting the coarse adjust control signal in a second direction to increase the range level of the oscillating frequency range when the synthesized signal lags the reference signal by a frequency greater than the coarse adjust threshold;

(e) adjusting the fine adjust control signal in the first direction to decrease the oscillating frequency within the oscillating frequency range when the synthesized signal leads the reference signal by a frequency less than a coarse adjust threshold but greater than a fine adjust threshold;

(f) adjusting the fine adjust control signal in the second direction to increase the oscillating frequency within the oscillating frequency range when the synthesized signal lags the reference signal by a frequency less than the coarse adjust threshold but greater than the fine adjust threshold.

8. The method of claim 6, step (a) further comprising the steps of:

(g) monitoring edges of the synthesized signal and the reference signal;

(h) generating a lead signal when a synthesized signal edge is detected before a reference signal edge;

(i) generating a lag signal when a synthesized signal edge is detected after a reference signal edge; and (j) generating a simultaneous signal when a synthesized signal edge and a reference signal edge are detected simultaneously; and step (b) further comprising the steps of:

(k) adjusting the coarse adjust control signal in a first direction to decrease the range level of the oscillating frequency range upon detection of:
  (i) three consecutive lead signals; or
  (ii) a simultaneous signal or a lead signal, followed by two consecutive lead signals; or
  (iii) two consecutive lead signals followed by a simultaneous signal; or
  (iv) a simultaneous signal followed by a lead signal followed by a simultaneous signal;

(l) adjusting the coarse adjust control signal in a second direction to increase the range level of the oscillating frequency range upon detection of:
  (i) three consecutive lag signals; or
  (ii) a simultaneous signal or a lag signal, followed by two consecutive lag signals; or
  (iii) two consecutive lag signals followed by a simultaneous signal; or
  (iv) a simultaneous signal followed by a lag signal followed by a simultaneous signal;

(m) adjusting the fine adjust control signal in the first direction to decrease the oscillating frequency within the oscillating frequency range upon detection of a lag signal followed by two consecutive lead signals; and (n) adjusting the fine adjust control signal in the second direction to increase the oscillating frequency within the oscillating frequency range upon detection of:
  (i) a lead signal followed by two consecutive lag signals;
  (ii) a lead signal followed by a simultaneous signal followed by a lag signal;
  (iii) two consecutive simultaneous signals followed by a lag signal; or
  (iv) a lag signal followed by a simultaneous signal followed by a lag signal.

9. A phase locked loop for providing multiple-gain frequency acquisition of a signal, comprising:

a phase detector responsive to a reference signal and a synthesized signal for producing a phase error signal;

a controller responsive to the phase error signal for generating a coarse adjust control signal and a fine adjust control signal; and a dual adjust current-controlled oscillator for producing the synthesized signal, said dual adjust current-control oscillator being responsive to the coarse adjust control signal for controlling a range level of an oscillating frequency range of the synthesized signal and the fine adjust control signal for controlling an oscillating frequency of the synthesized signal, wherein the oscillating frequency is within the oscillating frequency range.

10. The phase locked loop of claim 9, the dual adjust current controlled oscillator comprising:

one or more delay elements arranged in a ring to produce an oscillating output signal, each delay element producing an output signal at a first output node and a complemented output signal at a second output node, and each delay element being responsive to an input signal at a first input node, a complemented input signal at a second input node, each delay element comprising a high gain current source directly coupled to said first output node and said second output node, said high gain current source coupled to receive a coarse adjust control signal for controlling a frequency range level of an oscillating frequency range of the output signal and the complemented output signal, and each delay element comprising a low gain current source directly coupled to said first output node and said second output node, said low gain current source coupled to receive a fine adjust control signal for controlling a frequency of the output signal and complemented output signal, said frequency being within the oscillating frequency range.

11. The phase locked loop of claim 10, each delay element in the current controlled oscillator comprising a differential amplifier having a first arm amplifier circuit comprising a first coarse variable current source responsive to the coarse adjust control signal and coupled between a voltage source and the second output node, a first fine variable current source responsive to the fine adjust control signal and coupled between the voltage source and the second output node, and a first switch responsive to the input signal and coupled between the second output node and an internal node;

a second arm amplifier circuit comprising a second coarse variable current source responsive to the coarse adjust control signal and coupled between a voltage source and the first output node, a second fine variable current source responsive to the fine adjust control signal and coupled between the voltage source and the first output node, and a second switch responsive to the complemented input signal and coupled between the first output node and the internal node;

a tail circuit comprising a tail coarse variable current source responsive to the coarse adjust control signal and a tail fine variable current source responsive to the fine adjust control signal, the tail coarse variable current source and the tail fine variable current source each coupled between the internal node and a circuit ground;

and a capacitor coupled between the first output node and the second output node.

12. The phase locked loop of claim 11, wherein the first coarse variable current source, the second coarse variable current source, and the tail coarse variable current source each have a higher gain than each of the first fine variable current source, the second fine variable current source and the tail fine variable current source.

13. The phase locked loop of claim 12, wherein:

the respective first and second coarse variable current sources each comprise a plurality of high gain FETs coupled in source-drain relationship between the voltage source and the respective first and second output nodes, the gate of each high gain FET coupled to receive the coarse adjust control signal;

the respective first and second fine variable current sources each comprise a plurality of low gain FETs coupled in source-drain relationship between the voltage source and the respective first and second output nodes, the gate of each low gain FET coupled to receive the fine adjust control signal;

the tail coarse variable current source comprising a plurality of tail high gain FETs coupled in source-drain relationship between the internal node and the circuit ground, the gate of each of the plurality of tail high gain FETs coupled to receive the coarse adjust control signal; and the tail fine variable current source comprising a plurality of tail low gain FETs coupled in source-drain relationship between the internal node and the circuit ground, the gate of each tail low gain FETs coupled to receive the fine adjust control signal.

14. The phase locked loop of claim 13, the first switch comprising a first FET having a gate coupled to the first input node, a drain coupled to the second output node, and a source coupled to the internal node, and the second switch comprising a second FET having a gate coupled to the second input node, a drain coupled to the first output node, and a source coupled to the internal node.

15. The phase locked loop of claim 9, wherein the controller generates the coarse adjust control signal in the form of a coarse magnitude and a coarse direction, and the fine adjust control signal in the form of a fine magnitude and a fine direction.

16. The phase locked loop of claim 15, the controller further comprising:

coarse adjust control means for adjusting the coarse adjust control signal in a first direction to decrease the oscillating frequency when the synthesized signal leads the reference signal by a frequency greater than a coarse adjust threshold and for adjusting the coarse adjust control signal in a second direction to increase the oscillating frequency when the synthesized signal lags the reference signal by a frequency greater than the coarse adjust threshold;

fine adjust control means for adjusting the fine adjust control signal in the first direction to decrease the oscillating frequency when the synthesized signal leads the reference signal by a frequency less than a coarse adjust threshold but greater than a fine adjust threshold and for adjusting the fine adjust control signal in the second direction to increase the oscillating frequency when the synthesized signal lags the reference signal by a frequency less than the coarse adjust threshold but greater than the fine adjust threshold.

17. The phase locked loop of claim 9, the phase detector comprising means for performing the steps of:

(a) monitoring edges of the synthesized signal and the reference signal;

(b) generating a lead signal when a synthesized signal edge is detected before a reference signal edge;

(c) generating a lag signal when a synthesized signal edge is detected after a reference signal edge; and (d) generating a simultaneous signal when a synthesized signal edge and a reference signal edge are detected simultaneously;

and the controller comprising a digital state machine for performing the steps of:

(e) adjusting the coarse adjust control signal in a first direction to decrease the range level of the oscillating frequency range upon detection of:

(i) three consecutive lead signals; or (ii) a simultaneous signal or a lead signal, followed by two consecutive lead signals; or (iii) two consecutive lead signals followed by a simultaneous signal; or (iv) a simultaneous signal followed by a lead signal followed by a simultaneous signal;

(f) adjusting the coarse adjust control signal in a second direction to increase the range level of the oscillating frequency range upon detection of:

(i) three consecutive lag signals; or (ii) a simultaneous signal or a lag signal, followed by two consecutive lag signals; or (iii) two consecutive lag signals followed by a simultaneous signal; or (iv) a simultaneous signal followed by a lag signal followed by a simultaneous signal;

(g) adjusting the fine adjust control signal in the first direction to decrease the oscillating frequency within the oscillating frequency range upon detection of a lag signal followed by two consecutive lead signals; and (h) adjusting the fine adjust control signal in the second direction to increase the oscillating frequency within the oscillating frequency range upon detection of:

(i) a lead signal followed by two consecutive lag signals;

(ii) a lead signal followed by a simultaneous signal followed by a lag signal;

(iii) two consecutive simultaneous signals followed by a lag signal; or (iv) a lag signal followed by a simultaneous signal followed by a lag signal.

18. The phase locked loop of claim 17, the dual adjust current controlled oscillator comprising:

one or more delay elements arranged in a ring to produce an oscillating output signal, each delay element producing an output signal at a first output node and a complemented output signal at a second output node, and each delay element being responsive to an input signal at a first input node, a complemented input signal at a second input node, each delay element comprising a high gain current source directly coupled to said first output node and said second output node, said high gain current source coupled to receive a coarse adjust control signal for controlling a frequency range level of an oscillating frequency range of the output signal and the complemented output signal, and each delay element comprising a low gain current source directly coupled to said first output node and said second output node, said low gain current source coupled to receive a fine adjust control signal for controlling a frequency of the output signal and complemented output signal, said frequency being within the oscillating frequency range.

* * * * *